(12) United States Patent
Kimura et al.

(10) Patent No.: US 7,274,533 B2
(45) Date of Patent: Sep. 25, 2007

(54) DISK DEVICE

(75) Inventors: Akihiro Kimura, Akishima (JP); Kazuhito Shimomura, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 322 days.

(21) Appl. No.: 11/138,395

(22) Filed: May 27, 2005

(65) Prior Publication Data

US 2005/0264924 A1  Dec. 1, 2005

(30) Foreign Application Priority Data

May 31, 2004 (JP) ............................. 2004-161420

(51) Int. Cl.
*G11B 17/00* (2006.01)
(52) U.S. Cl. .................................. 360/97.01
(58) Field of Classification Search ... 360/97.01–97.04
See application file for complete search history.

(56) References Cited

U.S. PATENT DOCUMENTS

| | | | |
|---|---|---|---|
| 2004/0029458 A1 | 2/2004 | Wu | |
| 2004/0088456 A1 | 5/2004 | Zhang | |
| 2005/0243459 A1* | 11/2005 | Kimura et al. | 360/97.01 |
| 2005/0264923 A1* | 12/2005 | Kimura et al. | 360/97.01 |
| 2006/0002005 A1* | 1/2006 | Miyazaki et al. | 360/97.01 |

FOREIGN PATENT DOCUMENTS

| | | |
|---|---|---|
| EP | 0 536 891 B1 | 2/1997 |
| JP | 7-281838 | 10/1995 |
| JP | 2001-148188 | 5/2001 |

OTHER PUBLICATIONS

Australian Search Report dated Nov. 25, 2005 for Appln. No. 200502832-9.

* cited by examiner

*Primary Examiner*—Allen Cao
(74) *Attorney, Agent, or Firm*—Pillsbury Winthrop Shaw Pittman, LLP

(57) ABSTRACT

A control circuit board is opposed to an outer surface of a case in the form of a rectangular box, and an connector cable, which has connector terminals connectable with an external device, extends from the circuit board. The control circuit board has a plurality of first connector pads with a first property and a plurality of second connector pads with a second property different from the first property, the first and second connector pads being arranged side by side on the control circuit board. The connector cable has a proximal end portion connected to at least one type, among the first and second connector pads, and the connector terminals including a plurality of connector terminals connecting with the at least one type of connector pads to which the proximal end portion is connected.

12 Claims, 5 Drawing Sheets

DISK DEVICE

CROSS-REFERENCE TO RELATED APPLICATIONS

This application is based upon and claims the benefit of priority from prior Japanese Patent Application No. 2004-161420, filed May 31, 2004, the entire contents of which are incorporated herein by reference.

BACKGROUND OF THE INVENTION

1. Field of the Invention

This invention relates to a disk device having disks as recording media.

2. Description of the Related Art

In recent years, disk devices, such as magnetic disk devices, optical disk devices, etc., have been widely used as external recording devices of computers and image recording devices.

A magnetic disk device as an example of a disk device generally has a case in the form of a rectangular box. The case contains magnetic disks for use as magnetic recording media, a spindle motor, magnetic heads, and a head actuator. The spindle motor serves as drive means that supports and rotates the disks. The magnetic heads are used to write and read information to and from the disks. The head actuator supports the heads for movement with respect to the disks. Further, the case contains a voice coil motor, a substrate unit, etc. The voice coil motor rocks and positions the head actuator. The substrate unit has a head IC and the like.

A printed circuit board for controlling the respective operations of the spindle motor, voice coil motor, and magnetic heads through the substrate unit is screwed to the outer surface of the case. An interface (I/F) connector for connecting the magnetic disk device to an external device is soldered to an end portion of the circuit board.

In the magnetic disk device constructed in this manner, the pin arrangement of the interface connector and the like must be changed depending on the specifications of the external device to be connected. For example, the input side must be allotted to a predetermined pin of the interface connector for one external device, and the output side to the predetermined pin of the connector for another external device.

According to an information recording device described in Jpn. Pat. Appln. KOKAI Publication No. 7-281838, for example, a single common interface connector is used, and an IC for control that is connected to this interface connector is provided with an input/output circuit so that the properties of external terminals of the control IC can be selected by a plurality of selectors. Thus, the interface specifications can be changed in the control IC.

Recently, miniaturization of magnetic disk devices has been advanced to facilitate their use as recording devices of more varied electronic apparatuses, especially smaller-sized electronic apparatuses. In a magnetic disk device that uses disks with a diameter of 1 inch or more, for example, the printed circuit board overlapped on the surface of the case can be made smaller than the case surface in area. In a magnetic disk device that uses disks with a diameter of less than 1 inch, however, the printed circuit board must be reduced with the miniaturization of the case. Accordingly, an installation space on the printed circuit board lessens, so that a plurality of electronic components cannot be mounted on it with ease. The interface connector for connecting the magnetic disk device and the external device, in particular, is relatively tall and large-sized, so that it cannot be readily mounted on the circuit board. Further, it constitutes a hindrance to the reduction in overall thickness of the magnetic disk device including the printed circuit board. Likewise, it is necessary to miniaturize the control IC and other electronic components that are mounted on the printed circuit board. If the input/output circuit, selectors, etc. are incorporated in the control IC in the aforesaid manner, however, the circuit configuration is complicated, and the miniaturization of the IC is not easy.

BRIEF SUMMARY OF THE INVENTION

According to an aspect of the invention, there is provided a disk device comprising: a case; a disk-shaped recording medium located in the case; a drive motor which is located in the case and supports and rotates the recording medium; a head which processes information for the recording medium; a head actuator which is provided in the case, supports the head for movement, and moves the head with respect to the recording medium; a substrate unit provided in the case and connected to the head actuator; a control circuit board opposed to an outer surface of the case and connected to the substrate unit; and a connector cable which extends from the control circuit board and has connector terminals connectable with an external device. The control circuit board has a plurality of first connector pads with a first property and a plurality of second connector pads with a second property different from the first property, the first and second connector pads being arranged side by side on the control circuit board. The connector cable has a proximal end portion connected to at least one type, among the first and second connector pads, and the connector terminals includes a plurality of connector terminals connecting with the at least one type of connector pads to which the proximal end portion is connected.

DETAILED DESCRIPTION OF THE INVENTION

An HDD according to a first embodiment of this invention will now be described in detail with reference to the accompanying drawings.

Figure 1:
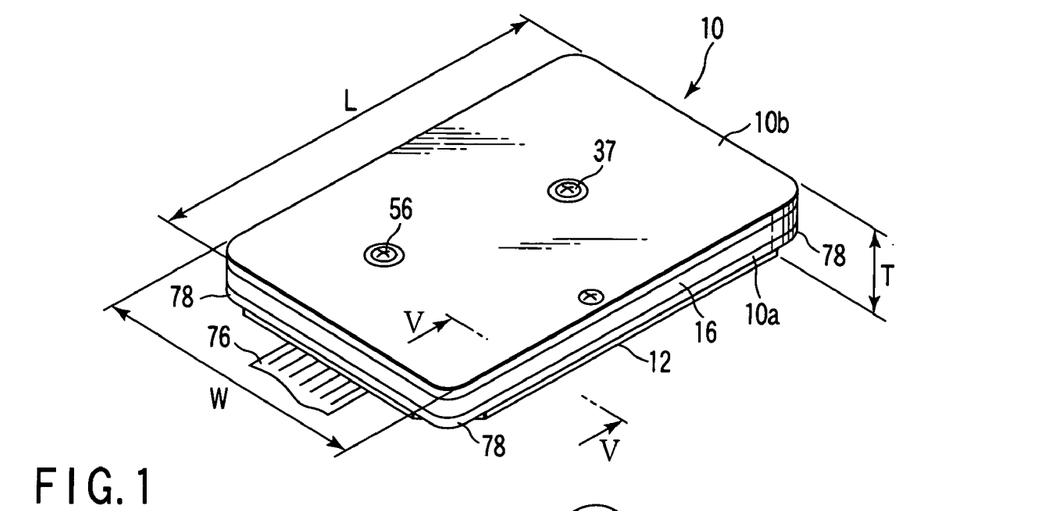
FIG. 1 is a perspective view showing a hard disk drive (hereinafter referred to as an HDD) according to a first embodiment of the invention.
Figure 2:
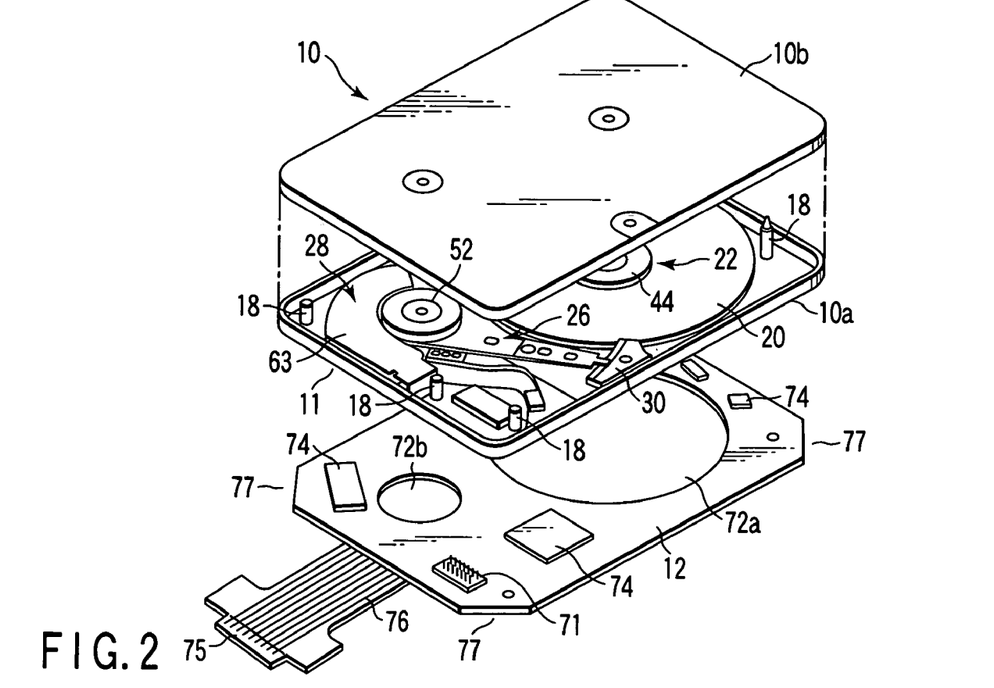
FIG. 2 is an exploded perspective view of the HDD.

As shown in FIGS. 1 and 2, the HDD comprises a case 10 in the form of a substantially rectangular box and a rectangular control circuit board 12. The case 10 contains various members, which will be described later. The circuit board 12 is overlapped on the outer surface of the case 10. The case 10 and the circuit board 12 each have a length L of 32 mm and a width W of 24 mm. A thickness T of a structure that combines the case and the control circuit board ranges from 3 to 6 mm. The thickness T is adjusted to, e.g., about 3.3 mm or 5 mm, depending on the number of disks to be held in the case.

Figure 3:
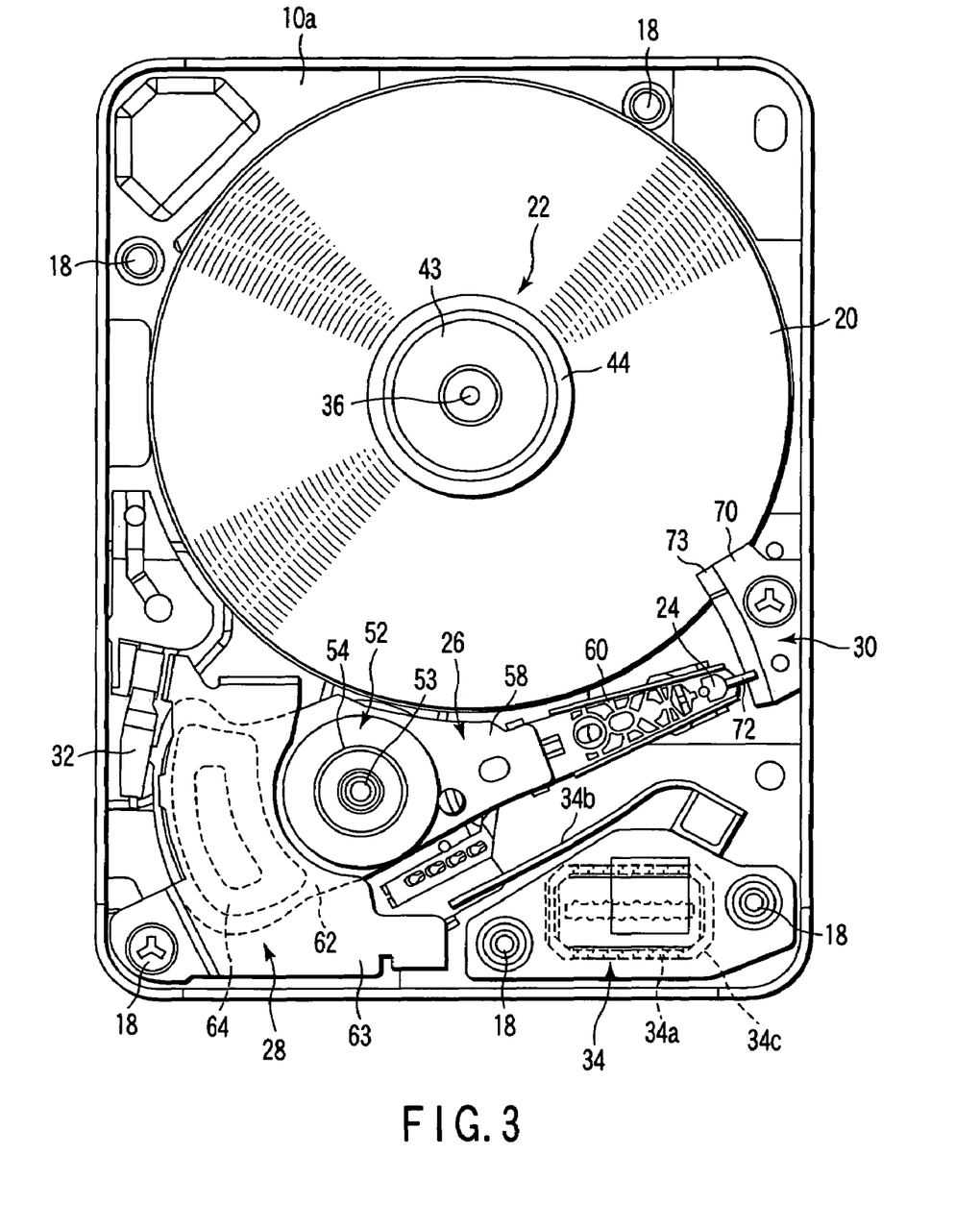
FIG. 3 is a plan view showing a case and the internal structure of the HDD.
Figure 4:
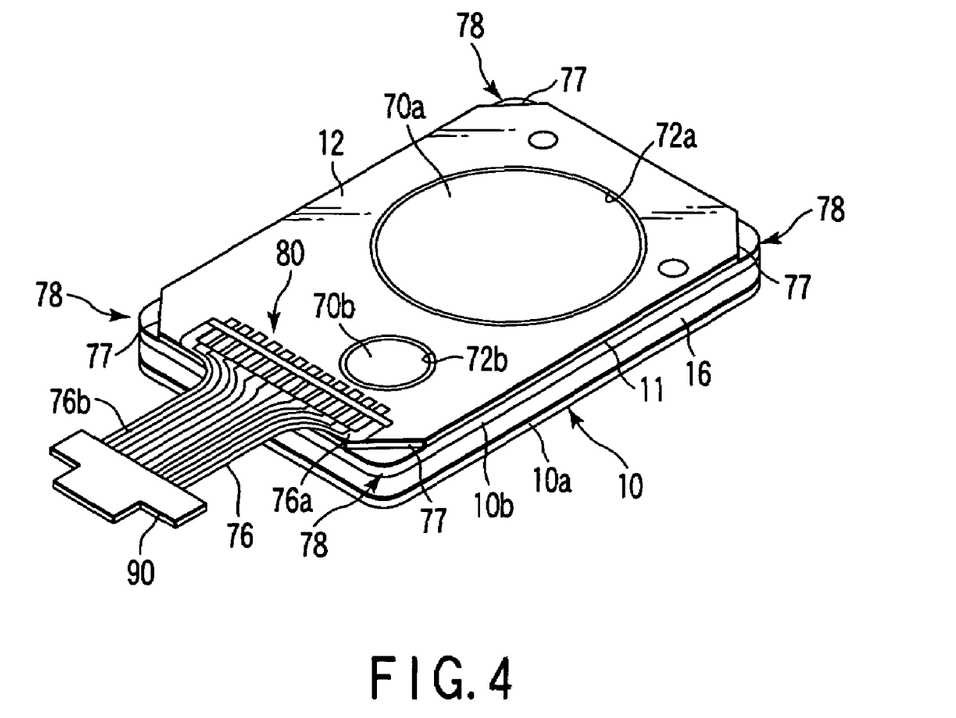
FIG. 4 is a perspective view showing the control circuit board side of the HDD.
Figure 5:
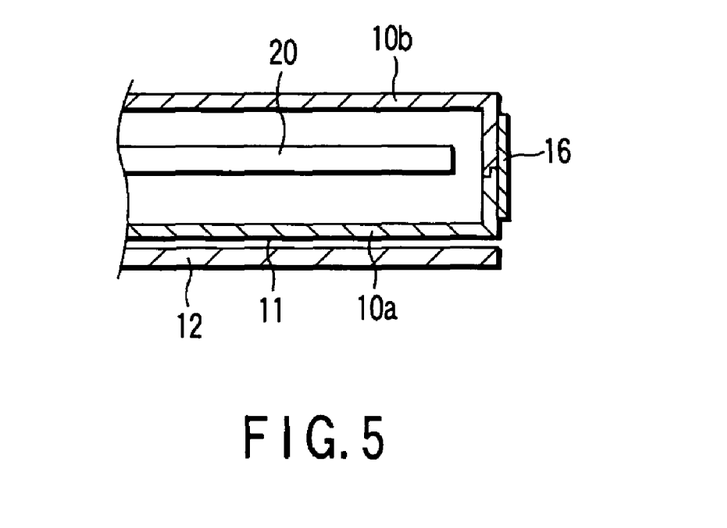
FIG. 5 is a sectional view of the HDD taken along line V-V of FIG. 1.

As shown in FIGS. 2 to 4, the case 10 comprises a first shell 10a and a second shell 10b that have substantially equal dimensions. The first and second shells 10a and 10b are substantially rectangular metallic structures, which have sidewalls set up on their respective peripheral edge portions. The shells 10a and 10b are arranged facing each other with their peripheral edge portions opposed. A belt-shaped seal member 16 is wound around the peripheral edge portions of the shells 10a and 10b. The seal member connects the peripheral edge portions of the shells and seals a gap between them. Thus, the case 10 is formed having the shape of a rectangular box.

The bottom surface of the first shell 10a forms a rectangular mounting surface 11. Four corners of the case 10, including the corners of the mounting surface 11, are rounded in a circular arc. Thus, the seal member 16 that is wound around the peripheral edge portion of the case 10 is prevented from being damaged by the corners of the case, and airtightness is prevented from being lowered by lifting of the seal member.

In the case 10, a plurality of support posts 18 are provided on the peripheral edge portion of the case. Each support post 18 has a proximal end fixed to the inner surface of the first shell 10a and is set substantially upright on the inner surface of the first shell. Corresponding to each support post 18 in position, a tapped hole is formed in the mounting surface 11 and extends into the post.

The case 10 contains a magnetic disk 20 of, e.g., 0.85-inch diameter, for use as an information recording medium, a spindle motor 22, a magnetic head 24, and a carriage 26. The spindle motor 22 supports and rotates the disk. The magnetic head 24 is used to write and read information to and from the disk. The carriage 26 supports the magnetic head 24 for movement with respect to the magnetic disk 20. Further, the case 10 contains a voice coil motor (hereinafter referred to as a VCM) 28, a ramp load mechanism 30, a solenoid latch 32, a substrate unit 34, etc. The VCM 28 rotates and positions the carriage 26. The ramp load mechanism 30 unloads into and holds the magnetic head 24 in a position off the magnetic disk 20 when the head is moved to the peripheral edge portion of the disk. The solenoid latch 32 holds the carriage 26 in a shunt position. The substrate unit 34 has a head IC and the like.

The spindle motor 22 is mounted on the first shell 10a. The motor 22 has a pivot 36, which is fixed to the inner surface of the first shell 10a and set substantially upright on it. An extended end of the pivot 36 is screwed to the second shell 10b by a fixing screw 37 that is externally screwed into the second shell. Thus, the pivot 36 is dually supported by the first and second shells 10a and 10b.

A rotor is rotatably supported on the pivot 36 by a bearing (not shown). That end portion of the rotor on the side of the second shell 10b constitutes a columnar hub 43, and the magnetic disk 20 is fitted coaxially on the hub. An annular clamp ring 44 is fitted on an end portion of the hub 43 and holds a circumstantial edge portion of the disk 20. Thus, the disk 20 is fixed to the rotor and supported for rotation integral with the rotor.

An annular permanent magnet (not shown) is fixed to an end portion of the rotor on the side of the first shell 10a so as to be coaxial with the rotor. The spindle motor 22 has a stator core attached to the first shell 10a and a plurality of coils wound on the stator core. The stator core and the coils are located outside and spaced from the magnet.

The carriage 26 that constitutes the head actuator is provided with a bearing assembly 52 that is fixed on the inner surface of the first shell 10a. The bearing assembly 52 has a pivot 53 and a cylindrical hub 54. The pivot 53 is set upright on the inner surface of the first shell 10a. The hub 54 is rotatably supported on the pivot 53 by a pair of bearings. An extended end of the pivot 53 is screwed to the second shell 10b by a fixing screw 56 that is externally screwed into the second shell. Thus, the pivot 53 is dually supported by the first and second shells 10a and 10b. The bearing assembly 52 that serves as a bearing portion is located side by side with the spindle motor 22 in the longitudinal direction of the case 10.

The carriage 26 comprises an arm 58 extending from the hub 54, a suspension 60 in the form of an elongate plate extending from the distal end of the arm, and a support frame 62 extending from the hub 54 in a direction opposite from the arm. The magnetic head 24 is supported on an extended end of the suspension 60 by a gimbals portion (not shown). The head 24 is subjected to a given head load toward the surface of the magnetic disk 20 by a spring force of the suspension 60. A voice coil 64 that constitutes the VCM 28 is fixed integrally to the support frame 62.

The VCM 28, which serves to rotate the carriage 26 around the bearing assembly 52, comprises a pair of yokes 63 and a magnet (not shown). The yokes 63 are fixed on the first shell 10a and opposed to each other with a gap between them. The magnet is fixed to the inner surface of one of the yokes and opposed to the voice coil 64. When the coil 64 is energized, the carriage 26 rotates between the shunt position shown in FIG. 3 and an operating position above the surface of the magnetic disk 20. The magnetic head 24 is positioned on a desired track of the disk 20. The solenoid latch 32 that is fixed to the first shell 10a latches the carriage 26 that is moved to the shunt position, thereby preventing the carriage from moving from the shunt position to the operating position if the HDD is subjected to any external force, such as a shock.

The ramp load mechanism 30 comprises a ramp member 70 and a tab 72. The ramp member 70 is fixed to the inner surface of the first shell 10a and situated opposite the peripheral edge portion of the magnetic disk 20. The tab 72 extends from the distal end of the suspension 60 and serves as an engaging member. The ramp member 70 is formed by bending a plate material and has a ramp surface 73 that can be engaged by the tab 72. When the carriage 26 rotates from the inner peripheral portion of the disk 20 to the shunt position outside the disk, the tab 72 engages the ramp surface 73 of the ramp member 70. Thereafter, the tab 72 is pulled up along a slope of the ramp surface to unload the magnetic head 24. When the carriage 26 rocks to the shunt position, the tab 72 is supported on the ramp surface 73 of the ramp member 70. Thereupon, the magnetic head 24 is kept off the surface of the magnetic disk 20.

The substrate unit 34 has a body 34a that is formed of a flexible printed circuit board. The body 34a is fixed to the inner surface of the first shell 10a. Electronic components, such as the head IC, a temperature sensor, etc., are mounted on the body 34a. The substrate unit 34 has a main flexible printed circuit board (hereinafter referred to as a main FPC) 34b that extends from the body 34a. An extended end of the main FPC 34b is connected to that part of the carriage 26 which is situated near the bearing assembly 52. Further, the extended end of the main FPC 34b is connected electrically to the magnetic head 24 by a cable (not shown) that is located on the arm 58 and the suspension 60. A connector 34c for connection with the control circuit board 12 is mounted on the bottom surface of the body of the substrate unit 34. The connector 34c is exposed to the mounting surface 11 of the first shell 10a through an opening in the first shell.

As shown in FIGS. 2 and 4, the control circuit board 12, a printed circuit board, is a rectangular structure that is substantially equal to the mounting surface 11 of the case 10 in length and width. The mounting surface 11 of the case 10 is formed having circular protrusions 70a and 70b that correspond to the spindle motor 22 and the bearing assembly 52, respectively. The control circuit board 12 is formed having circular openings 72a and 72b that correspond to the protrusions 70a and 70b, respectively. Four corner portions of the circuit board 12 are obliquely cut at, e.g., 45 degrees to each side, and individually form notch portions 77. A plurality of electronic components 74 and a connector 71 are mounted on the circuit board 12. Further, a flexible printed circuit board 76 for electrical connection between the HDD and an external device is connected to the circuit board 12. It is drawn out from one short side of the circuit board 12, and a plurality of connector terminals 75 are formed on its extended end.

Figure 6:
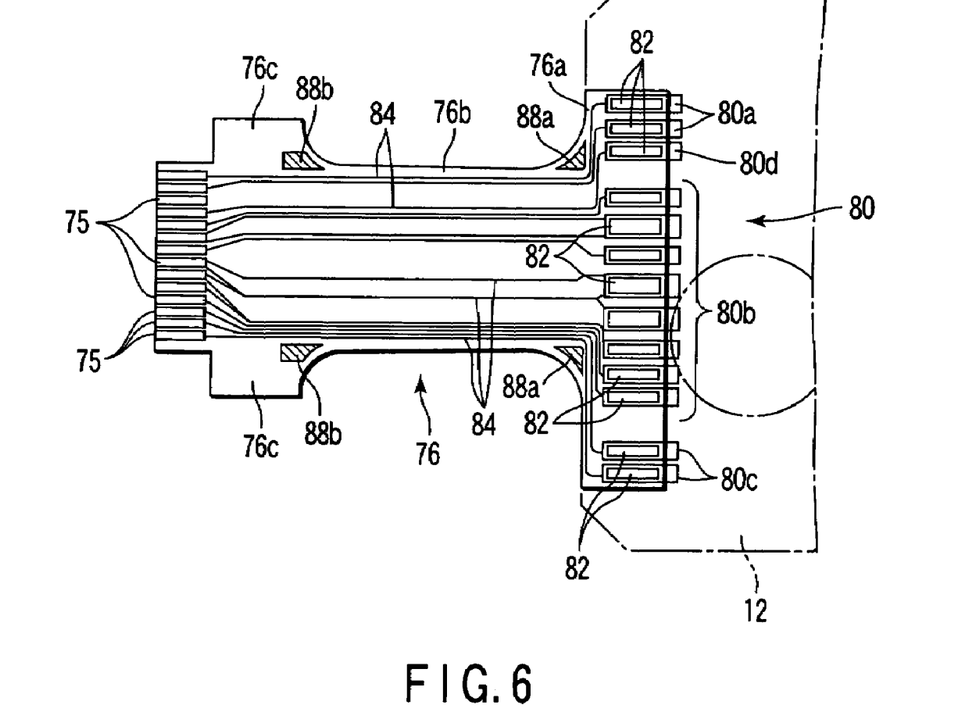
FIG. 6 is a plan view showing a control circuit board and an FPC of the HDD.
Figure 7:
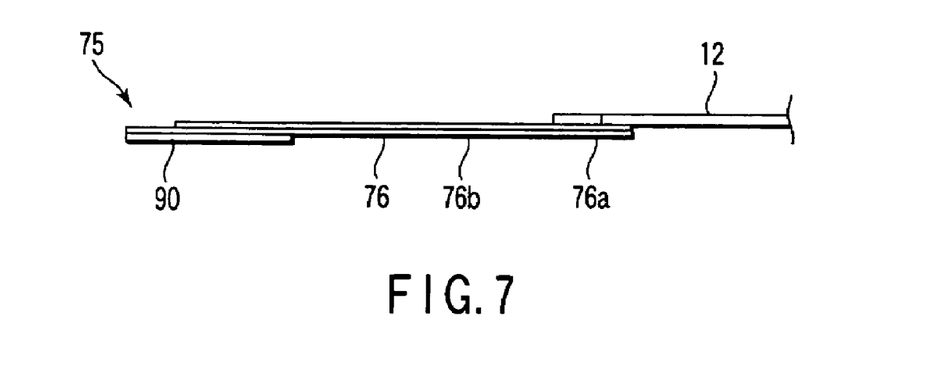
FIG. 7 is a side view showing the control circuit board and the FPC of the HDD.

As shown in FIGS. 4, 6 and 7, on the outer surface of the control circuit board 12 are provided a plurality of, e.g., 13, connector pads 80 for electrical connection between the HDD and the external device. The pads 80 are located near and along one side of the circuit board 12. In the present embodiment, the pads 80 are arranged along that one of short sides of the circuit board 12 which is situated on the side of the bearing assembly 52. Each connector pad 80 has the shape of an elongate rectangle, which extends in the longitudinal direction of the circuit board 12. The pads 80 are separated from one another by gaps between them.

The connector pads 80 include two first connector pads 80a, eight second connector pads 80b, two third connector pads 80c, and a spare connector pad 80d. The first pads 80a serve as connector terminals for a universal serial bus (USB) as a first property. The second pads 80b serve as connector terminals that conform to memory card standards as a second property. The third pads 80c serve as connector terminals for a serial interface as a third property.

The flexible printed circuit board (hereinafter referred to as an FPC) 76 that serves as a connector cable is connected to the connector pads of at least one optionally selected type, among the first, second, and third connector pads 80a, 80b and 80c. According to the present embodiment, the FPC 76 is connected to the connector pads of all types, i.e., the first, second, and third connector pads 80a, 80b and 80c. The FPC 76 is provided integrally with a proximal end portion 76a, a belt-shaped extending portion 76b, and a pair of grip portions 76c. The proximal end portion 76a is fixed on the control circuit board 12 so as to overlap the connector pads 80 and extend along the array of the pads. The extending portion 76b extends from the proximal end portion and has the connector terminals 75 on its extended end. Near the terminals 75, the grip portions 76c extend individually on the opposite sides from the extending portion. The proximal end portion 76a is formed having thirteen pads 82 that are situated corresponding to the connector pads 80, individually. These pads 82 are situated individually overlapping the connector pads 80 of the control circuit board 12 and connected electrically to the pads 80.

The extended end of the extending portion 76b is provided with the thirteen connector terminals 75 that correspond to the connector pads 80, individually. Each of the terminals 75 has the shape of an elongate rectangle and extends in the extending direction of the extending portion 76b. The terminals 75 are arranged at right angles to the extending direction with gaps between them. The connector terminals 75 are connected to their corresponding pads 82 by conductor lines 84 that are formed on the proximal end portion 76a and the extending portion 76b. Thus, the connector pads 80 connect with their corresponding connector terminals 75.

The pads 82, connector terminals 75, and conductor lines 84 are each formed of a copper foil on an insulating layer. Reinforcing copper foils 88a are provided individually at those corner portions of the FPC 76 which are situated near the boundary between the proximal end portion 76a and the extending portion 76b. Reinforcing copper foils 88b are provided individually at those corner portions which are situated near the boundary between each grip portion 76c and the extending portion 76b.

A substantially T-shaped liner plate 90 is pasted overlapping on the extended end portion of the extending portion 76b, including the connector terminals 75, and the respective reverse sides of the paired grip portions 76c. The liner plate 90 is formed of an electrically nonconductive material, such as acrylic resin, and reinforces the extended end portion of the FPC 76. The extended end portion of the FPC 76 constructed in this manner is caused to engage a connector of an external device or the like, and the connector terminals 75 are connected electrically to terminals of the external device, whereupon the HDD can be connected to the external device. In doing this, the grip portions 76c of the FPC 76 that are reinforced by the liner plate 90 are held and connected. Thus, the connecting ends of the FPC 76 can be easily securely connected to the extended end portion. For simplicity of drawing, the liner plate 90 is not shown in FIG. 6.

The control circuit board 12, constructed in this manner, is overlapped on the mounting surface 11 of the case 10 and screwed to the first shell 10a with screws. As this is done, the circuit board 12 is located with its four sides aligned or coincident individually with four sides of the mounting surface 11. The protrusions 70a and 70b on the mounting surface 11 are located in the openings 72a and 72b, respectively, of the circuit board 12. The connector 71 on the circuit board 12 is connected to the connector on the substrate unit 34.

The notch portions 77 at the four corner portions of the control circuit board 12 are situated corresponding individually to the four corner portions of the mounting surface 11. Thus, the four corner portions of the mounting surface 11 are exposed to the outside without being covered by the circuit board 12. The corner portions of the case 10, including the four exposed corner portions of the mounting surface 11, individually constitute retaining portions 78 for holding the case without contact with the circuit board 12.

According to the HDD constructed in this manner, the control circuit board 12 is provided with the first to third connector pads 80a, 80b and 80c that have different properties. The FPC 76 is connected to any desired one of these connector pads 80a, 80b and 80c and lead out of the circuit board 12. The HDD can be connected electrically to the external device by connecting the connector terminals on the extended end of the FPC 76 to the external device. Thus, the connector that is relatively large-sized can be omitted so that the overall thickness of the HDD including the circuit board 12 is reduced. Further, the HDD can be connected to varied external devices by alternatively using any desired one of the connector pads that have a plurality of types of properties. Thus, there may be obtained a small-sized HDD with high general-purpose properties. The card-type portable HDD constructed in this manner may be used as a recording device of any of various electronic apparatuses, such as a cell phone, digital camera, video camera, personal digital assistant (PDA), etc.

According to the HDD described above, the extended end portion of the FPC 76 is provided with the grip portions 76c that can be nipped between fingers. The reinforcing liner plate 90 is fixed to the extended end portion and the grip portions 76c. Thus, the connecting ends of the FPC 76 can be easily securely connected to and disconnected from connectors of the external device by utilizing the grip portions 76c.

Figure 8:
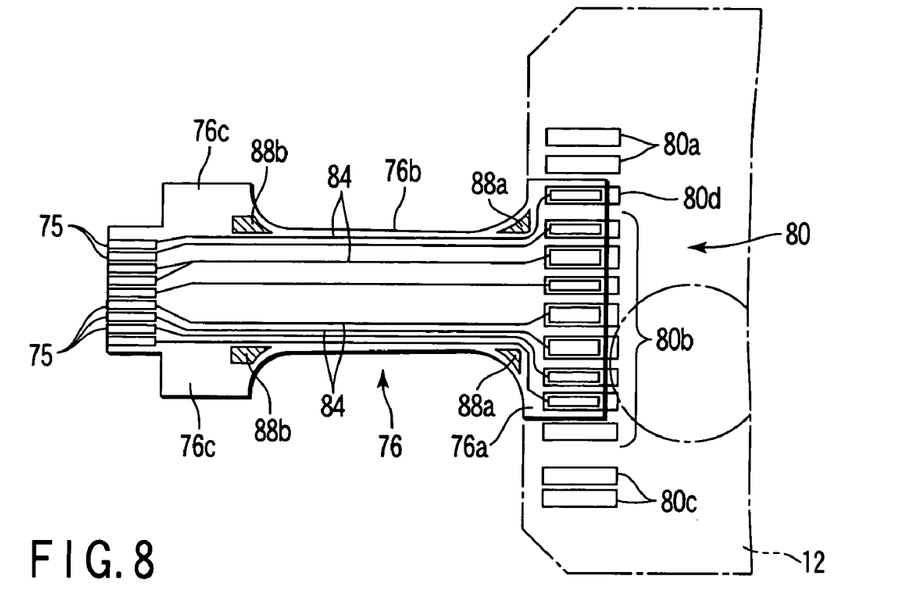
FIG. 8 is a plan view showing a control circuit board and an FPC of a HDD according to a second embodiment of the invention.
Figure 9:
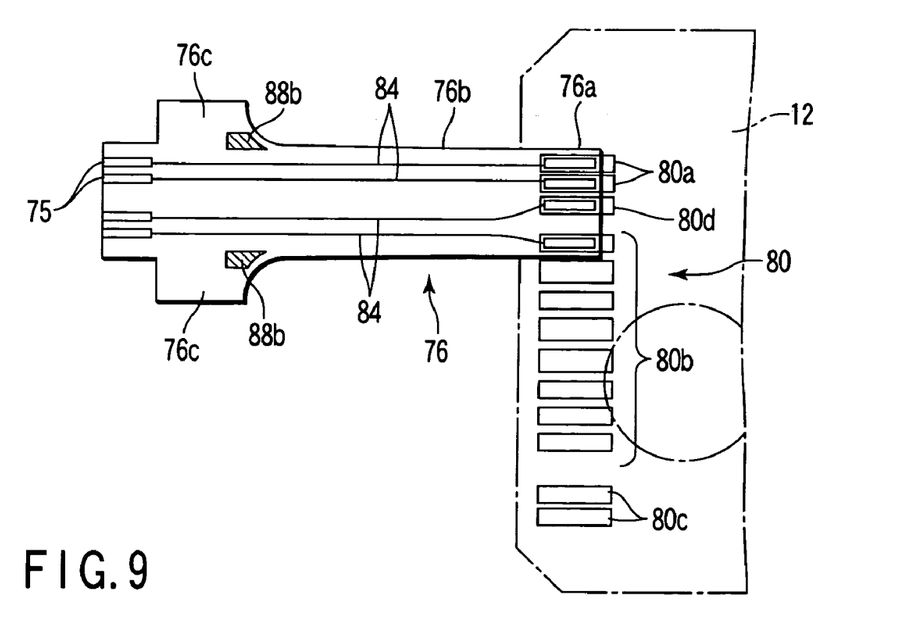
FIG. 9 is a plan view showing the control circuit board and the FPC of the HDD according to the second embodiment.

Although the FPC 76 is connected to all the types of connector pads of the control circuit board 12 according to the foregoing embodiment, it is only expected to be connected to at least one type of connector pads. According to a second embodiment shown in FIG. 8, an FPC 76 has pads 82 that are connected to only connector pads 80b and 80d of a control circuit board 12. According to a third embodiment shown in FIG. 9, an FPC 76 has pads 82 that are connected to only connector pads 80a and 80d of a control circuit board 12. In either of the embodiments, the HDD can be connected to an external device by using connector pads of any desired one of types, that is, interfaces of any desired type.

In the second and third embodiments, other configurations are identical with those of the first embodiment. Therefore, like reference numerals are used to designate like portions of the embodiments, and a detailed description of those portions is omitted. The same functions and effects of the first embodiment may be also obtained according to the second and third embodiments.

This invention is not limited directly to the embodiments described above, and its components may be embodied in modified forms without departing from the scope or spirit of the invention. Further, various inventions may be made by suitably combining a plurality of components described in connection with the foregoing embodiments. For example, some of the components according to the foregoing embodiments may be omitted. Furthermore, components according to different embodiments may be combined as required.

The properties of the connector pads on the control circuit board may be of two types or four or more types. Further, the properties of the connector pads are not limited the ones described in connection with the foregoing embodiments, but may be any other interfaces. The number of magnetic disk(s) in the HDD is not limited to one but may be increased as required. The number of head(s) is not limited to one but may be increased as required. The size of the magnetic disk used is not limited to 0.85 inch but may alternatively be 1.8 or 2.5 inches.

What is claimed is:

1. A disk device comprising:
   a case;
   a disk-shaped recording medium located in the case;
   a drive motor which is located in the case and supports and rotates the recording medium;
   a head which processes information for the recording medium;
   a head actuator which is provided in the case, supports the head for movement, and moves the head with respect to the recording medium;
   a substrate unit provided in the case and connected to the head actuator;
   a control circuit board opposed to an outer surface of the case and connected to the substrate unit; and
   a connector cable which extends from the control circuit board and has connector terminals connectable with an external device,
   the control circuit board having a plurality of first connector pads with a first property and a plurality of second connector pads with a second property different from the first property, the first and second connector pads being arranged side by side on the control circuit board,
   the connector cable having a proximal end portion connected to at least one type, among the first and second connector pads, and the connector terminals including a plurality of connector terminals connecting with the at least one type of connector pads to which the proximal end portion is connected.

2. A disk device according to claim 1, wherein the connector cable has a proximal end portion connected to the first and second connector pads, and the connector terminals include a plurality of connector terminals connecting with the connector pads to which the proximal end portion is connected.

3. A disk device according to claim 1, wherein the case is in the form of a rectangular box, the control circuit board has a substantially rectangular shape corresponding to the outer surface of the case, and the connector pads are arranged along one side of the control circuit board.

4. A disk device comprising:
   a case;
   a disk-shaped recording medium located in the case;
   a drive motor which is located in the case and supports and rotates the recording medium;
   a head which processes information for the recording medium;
   a head actuator which is provided in the case, supports the head for movement, and moves the head with respect to the recording medium;
   a substrate unit provided in the case and connected to the head actuator;
   a control circuit board opposed to an outer surface of the case and connected to the substrate unit; and
   a connector cable which extends from the control circuit board and has connector terminals connectable with an external device,
   the control circuit board having a plurality of first connector pads with a first property, a plurality of second connector pads with a second property different from the first property, and a plurality of third connector pads with a third property different from the first and second properties, the first, second, and third connector pads being arranged side by side on the control circuit board,
   the connector cable having a proximal end portion connected to at least one type, among the first, second and third connector pads, and the connector terminals including a plurality of connector terminals connecting with the at least one type, among the first, second and third connector pads to which the proximal end portion is connected.

5. A disk device according to claim 4, wherein the connector cable has a proximal end portion connected to the connector pads of at least two types, among the first, second, and third connector pads, and the connector terminals include a plurality of connector terminals connecting with the connector pads of the at least two types to which the proximal end portion is connected.

6. A disk device according to claim 4, wherein the connector cable has a proximal end portion connected to the first, second, and third connector pads, and the connector terminals include a plurality of connector terminals connecting with the first, second, and third connector pads.

7. A disk device according to claim 4, wherein the case is in the form of a rectangular box, the control circuit board has a substantially rectangular shape corresponding to the outer surface of the case, and the connector pads are arranged along one side of the control circuit board.

8. A disk device according to claim 7, wherein the head actuator has a bearing portion and an arm which is rotatably supported by the bearing portion and supports the head, the drive motor and the bearing portion are arranged side by side in the longitudinal direction of the case, and the plurality of connector pads are arranged along that one of short sides of the control circuit board which is situated on the bearing portion side.

9. A disk device according to claim 7, wherein the connector cable is formed of a flexible printed circuit board, the flexible printed circuit board having a proximal end portion extending in the direction of arrangement of the connector pads, a belt-shaped extending portion extending from the proximal end portion and provided with the connector terminals on an extended end thereof, and grip portions extending individually on the opposite sides from the extending portion in the vicinity of the connector terminals, and a liner plate pasted overlapping on the extending portion and the grip portions in the vicinity of the connector terminals.

10. A disk device according to claim 9, wherein the flexible printed circuit board includes copper foils which reinforce a boundary between the proximal end portion and the extending portion and boundaries between the extending portion and the grip portions.

11. A disk device according to claim 4, wherein the case and the control circuit board are formed having a longitudinal dimension of about 32 mm, a transverse dimension of about 24 mm, and a resultant thickness of about 3 to 6 mm.

12. A disk device according to claim 4, wherein the recording medium has a diameter of 0.85 inch.

* * * * *